(12) United States Patent
Naji

(10) Patent No.: US 6,236,611 B1
(45) Date of Patent: May 22, 2001

(54) PEAK PROGRAM CURRENT REDUCTION APPARATUS AND METHOD

(75) Inventor: Peter K. Naji, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/467,788

(22) Filed: Dec. 20, 1999

(51) Int. Cl.[7] ................................................ G11C 8/00
(52) U.S. Cl. ................................................ 365/226; 365/242
(58) Field of Search ...................................... 365/226, 242

(56) References Cited

U.S. PATENT DOCUMENTS 5,534,793 * 7/1996 Nasserbakht .......................... 326/44

* cited by examiner

Primary Examiner—David Nelms
Assistant Examiner—M. Tran
(74) Attorney, Agent, or Firm—William E. Koch

(57) ABSTRACT

Apparatus and method for reducing peak program current in memories include providing a memory with an array of memory cells arranged in rows and columns and having a plurality of current terminals and sequentially supplying current to each current terminal of the plurality of current terminals. The array is fabricated in a semiconductor chip with connections to a current supply within the semiconductor chip including a plurality of layers of metal connected by vias in the semiconductor chip. In one embodiment, the array includes tunnel junction MRAM cells integrated into a semiconductor chip with current sources. The current sources are integrated between the array of memory cells and the connections to the current supply within the semiconductor chip and are sequentially operated

19 Claims, 4 Drawing Sheets

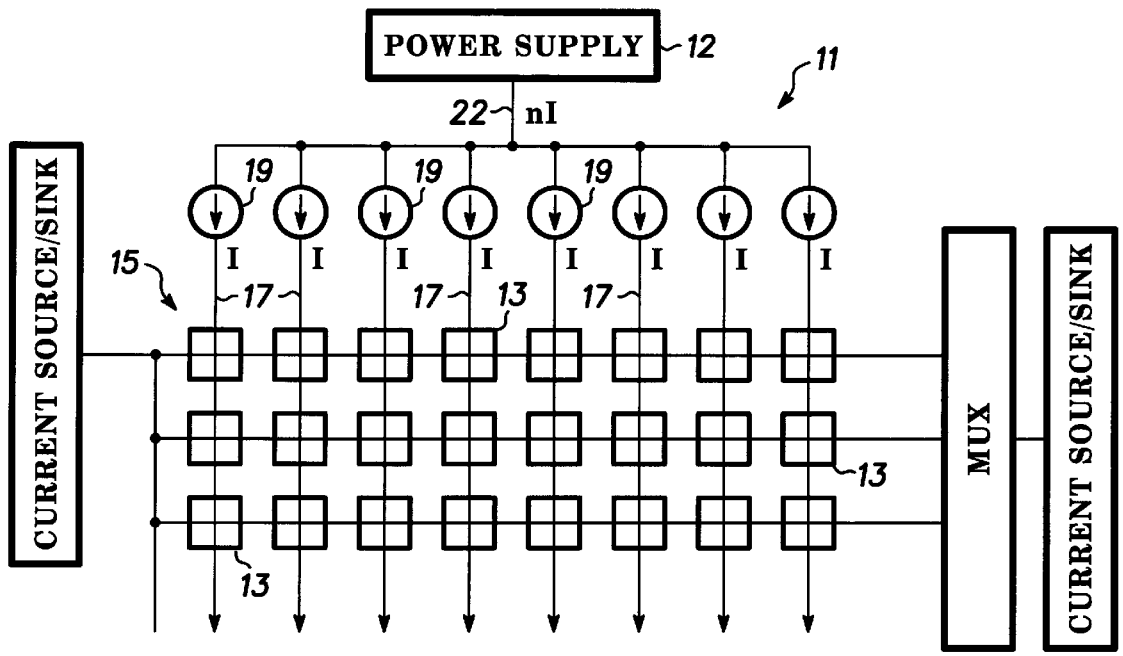
FIG. 1    *10*    - PRIOR ART -
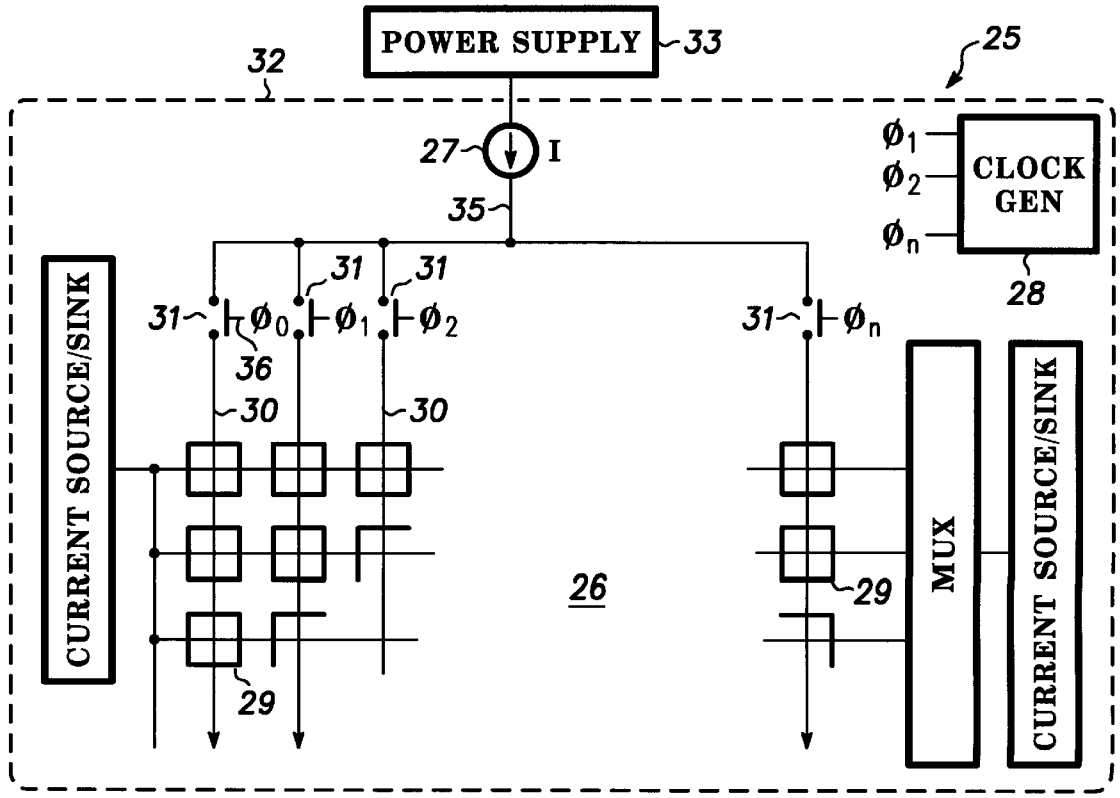
FIG. 2

US 6,236,611 B1

PEAK PROGRAM CURRENT REDUCTION APPARATUS AND METHOD

FIELD OF THE INVENTION

This invention relates to apparatus and methods for reducing peak program current in MRAM type memories and the like.

BACKGROUND OF THE INVENTION

In the programming of a xn-bit memory, such as an n-bit tunnel junction MRAM memory or the like, there is a need for n-digit line currents I, or 'n' wordline currents I, or 'n' bitline currents I, where 'n' is the number of bits in a word, e.g. 16, 32, 64, etc. The total programming current of 'n' digitlines adds up to nI current which is an unacceptable level. For example, in a 256×16 bit memory, the programming of a 16 bit word requires 16 bitline currents, or 16I, to flow from the current supply. When 16I current flows through the current supply lines, which are made up of metal and vias connecting layers of metal together, the vias become prone to electromigration damage, or migration of the metal, due to the excessive current flow.

Accordingly it is highly desirable to provide apparatus which overcomes these problems and which is inexpensive and easy to install and use.

BRIEF DESCRIPTION OF THE DRAWINGS

Referring to the drawings:

FIG. 1 is a simplified schematic view of a memory connected by standard apparatus to a power supply;

FIG. 2 is a simplified schematic view of one embodiment of apparatus including a memory connected to a power supply in accordance with the present invention;

DESCRIPTION OF THE PREFERRED EMBODIMENTS

Figure 3:
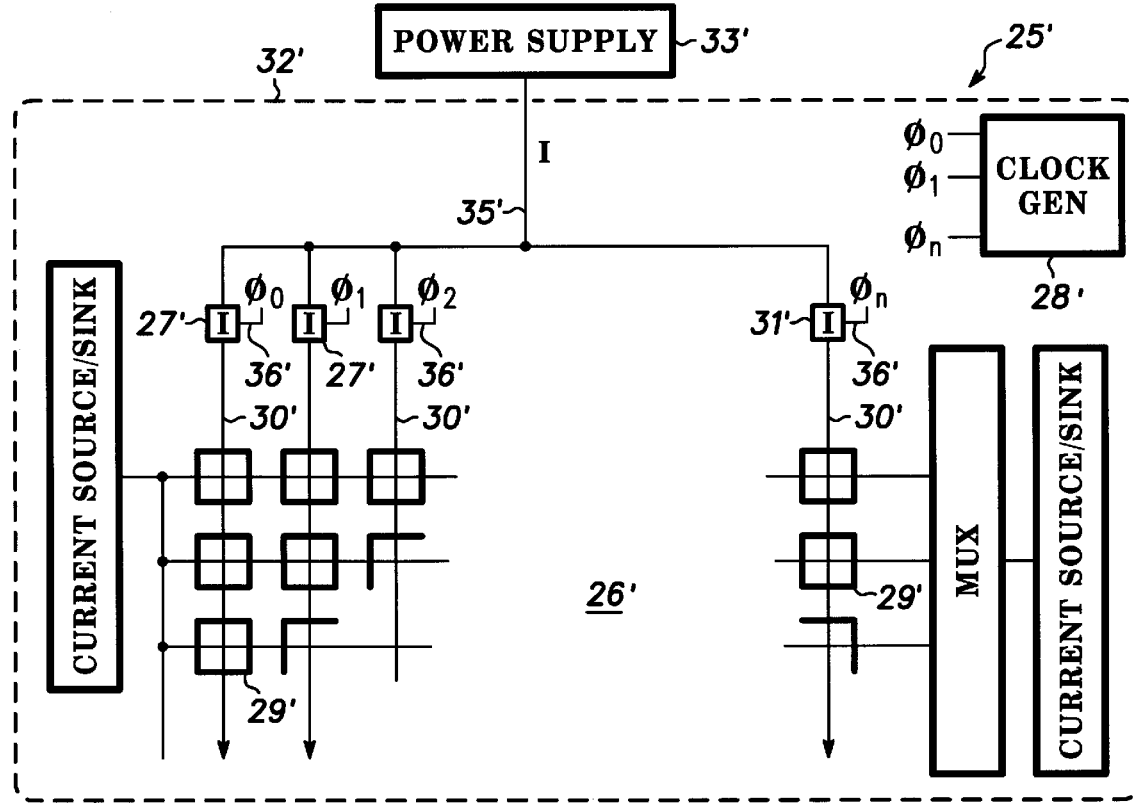
FIG. 3 is a simplified schematic view of another embodiment of apparatus including a memory connected to a power supply in accordance with the present invention.

Turning now to FIG. 1, a simplified schematic view is illustrated of a memory 10 connected by standard apparatus 11 to a power supply 12. Memory 10 includes an array of memory cells 13 fabricated in rows and columns in a well known fashion. Generally, a row (e.g. 15) of memory cells includes 'n' bits which define a word, where 'n' is the number of bits in the word, e.g. 8, 16, 32, 64, etc. Each column of cells has a current line 17 connected thereto for supplying current to a selected cell in the column. Current lines 17 may be, for example, digit lines, wordlines, bitlines, etc., depending upon the terminology and type of cells 13 included in memory array 10.

In this standard apparatus, each current line 17 is connected to a separate current source 19 and each current source 19 is in turn connected to power supply 12. Generally, the entire structure (except for power supply 12) is fabricated on a semiconductor chip with an external terminal for connecting power supply 12 to the chip. Also, connections or current supply lines, designated 22, between current sources 19 and the external terminal or power supply 12 are fabricated in a plurality of layers of metal connected by vias in the semiconductor chip. Further, all 'n' current sources 19 in a word are enabled simultaneously by applying an enable signal to a current control (not shown). Thus, since each of the 'n' cells draws an amount of current designated 'I', nI current is drawn from power supply 12 when an 'enable' signal is applied. When nI current flows through current supply lines 22, which are made up of metal and vias connecting layers of metal together, the vias become prone to electromigration damage, or migration of the metal, due to the excessive current flow. This electromigration can substantially reduce the life and reliability of memory 10.

Turning now to FIG. 2, a simplified schematic diagram is illustrated of apparatus 25 for reducing peak program current in accordance with the present invention. Apparatus 25 includes a memory 26, a current source 27, and a clock generator 28. Memory 26 includes an array of memory cells 29 arranged in rows and columns and having a plurality (n) of current terminals 30. Memory cells 29 are integrated into a semiconductor chip 32, along with current terminals 30, current sources 27 and clock generator 28. Generally, current is supplied through current source 27 to memory cells 29 from a power supply 33 by means of connections or current supply lines 35, which are made up of metal and vias connecting the layers of metal together. Current supply lines 35 may also be interpreted to include the current return lines (not shown) on the opposite side of memory 26.

In this embodiment, memory cells 29 are magnetic random access memory (MRAM) cells and preferably magnetic tunneling junction MRAM cells or simply tunnel junctions. For purposes of this disclosure the term "MRAM", stands for Magnetic Random Access Memory and is defined herein as including any of the relatively recently developed thin film magnetic memory cells including magnetic tunneling junctions (MTJ), giant magnetic resonance cells (GMR), and thin magnetic film junctions separated by an electrical conductor or an electrical insulator, etc. Examples of MRAMs of each of these types are described in the patents set forth below, all of which are incorporated herein by reference. U.S. Pat. No. 5,702,831, entitled "Ferromagnetic GMR Material", issued Dec. 30, 1997; U.S. Pat. No. 5,732, 016, entitled "Memory Cell Structure in a Magnetic Random Access Memory and a Method for Fabricating Thereof", issued Mar. 24, 1998; and U.S. Pat. No. 5,702,831, entitled "Multi-Layer Magnetic Tunneling Junction Memory Cells", issued Mar. 31, 1998.

One each of a plurality (n) of switches 31 is connected to each of the plurality (n) of current terminals 30 and to current source 27. Each switch 31 completes an electronic circuit which connects current source 27 to the associated current terminal 30 in an ON mode and disconnects current source 27 from the associated current terminal 30 in an OFF mode. Also, each switch 31 includes a switching input 36 connected to receive a clock signal from clock generator 28 for switching each switch 31 between the OFF mode and the ON mode. Clock generator 28 has a plurality of outputs $\phi_0$ through $\phi_n$, one each coupled to each switch 31.

Clock generator 28 is constructed to sequentially provide a clock signal to each of the plurality of switching inputs. That is, clock generator 28 produces 'n' different phase signals ($\phi_0$ through $\phi_n$) at the 'n' outputs so that only the electronic switch in one column of memory cells 29 is turned ON at a time. Here it should be understood that switches 31 could be connected in the current return lines on the opposite side of memory 26, if desired. With switches 31 connected in either the current source lines (current terminals 30) or the current return lines (not shown), current source 27 provides only one programming current I at a time. Therefore, connections or current supply lines 35 only have one current I flowing at any time and little or no electromigration occurs so that the life and reliability of apparatus 25 is substantially improved. While the time required for programming may be increased by programming a single bit at a time instead of 'n' bits, it will be understood that this is generally limited to programming which does not slow the operation of the memory.

Turning now to FIG. 3, a simplified block diagram is illustrated of another embodiment of apparatus, designated 25', for reducing peak program current in accordance with the present invention. In this embodiment, components which are similar to the embodiment illustrated in FIG. 2 are designated with similar numbers and a prime is added to the numbers to indicate a different embodiment. Apparatus 25' includes a memory 26', a plurality (n) of switchable current sources 27', and a clock generator 28'. Memory 26' includes an array of memory cells 29' arranged in rows and columns and having a plurality of current terminals 30', one each on the current source side of each column of memory cells 29'. In this embodiment, current is supplied to each current source 27' from a power supply 33' by means of connections or current supply lines 35', which are made up of metal and vias connecting the layers of metal together. Current supply lines 35' may also include current return lines on the opposite side of memory 26'.

Switchable current sources 27' are coupled one each to each of the plurality (n) of current terminals 30' so as to provide the plurality (n) of switchable current sources 27' each with an associated current terminal 30'. Here it should be noted that in some instances when current sources are positioned at the current return side of memory 26' they are referred to as 'current sinks'. However, for continuity in this disclosure, the term 'current source' will be used regardless of the position in the circuit. Each current source 27' includes an electronic circuit (e.g. a switch) connected to supply current from current source 27' to the associated current terminal 30' in an ON mode and to not supply current to the associated current terminal 30' in an OFF mode. Also, each switchable current source 27' includes a switching input 36' connected to receive a clock signal ($\phi_0$ through $\phi_n$) from clock generator 28' for switching current source 27' between the OFF mode and the ON mode. Clock generator 28' has a plurality (n) of outputs $\phi_0$ through $\phi_n$, one each coupled to each switching input 36' of each of the plurality of current sources 27'.

Clock generator 28' is constructed to sequentially provide clock signals $\phi_0$ through $\phi_n$ to each of the plurality of switching inputs. That is, clock generator 28' produces 'n' different phase signals at the 'n' outputs so that only one current source 27' is turned ON at a time. Here it should be understood that switchable current sources 27' could be connected in the current return lines on the opposite side of memory 26', if desired. With switchable current sources 27' connected in either the current source lines (current terminals 30') or the current return lines (not shown), only one current source 27' is conducting current I at a time. Therefore, connections or current supply lines 35' only have a current I flowing at any time and little or no electromigration occurs so that the life and reliability of apparatus 25' is substantially improved.

Figure 4:
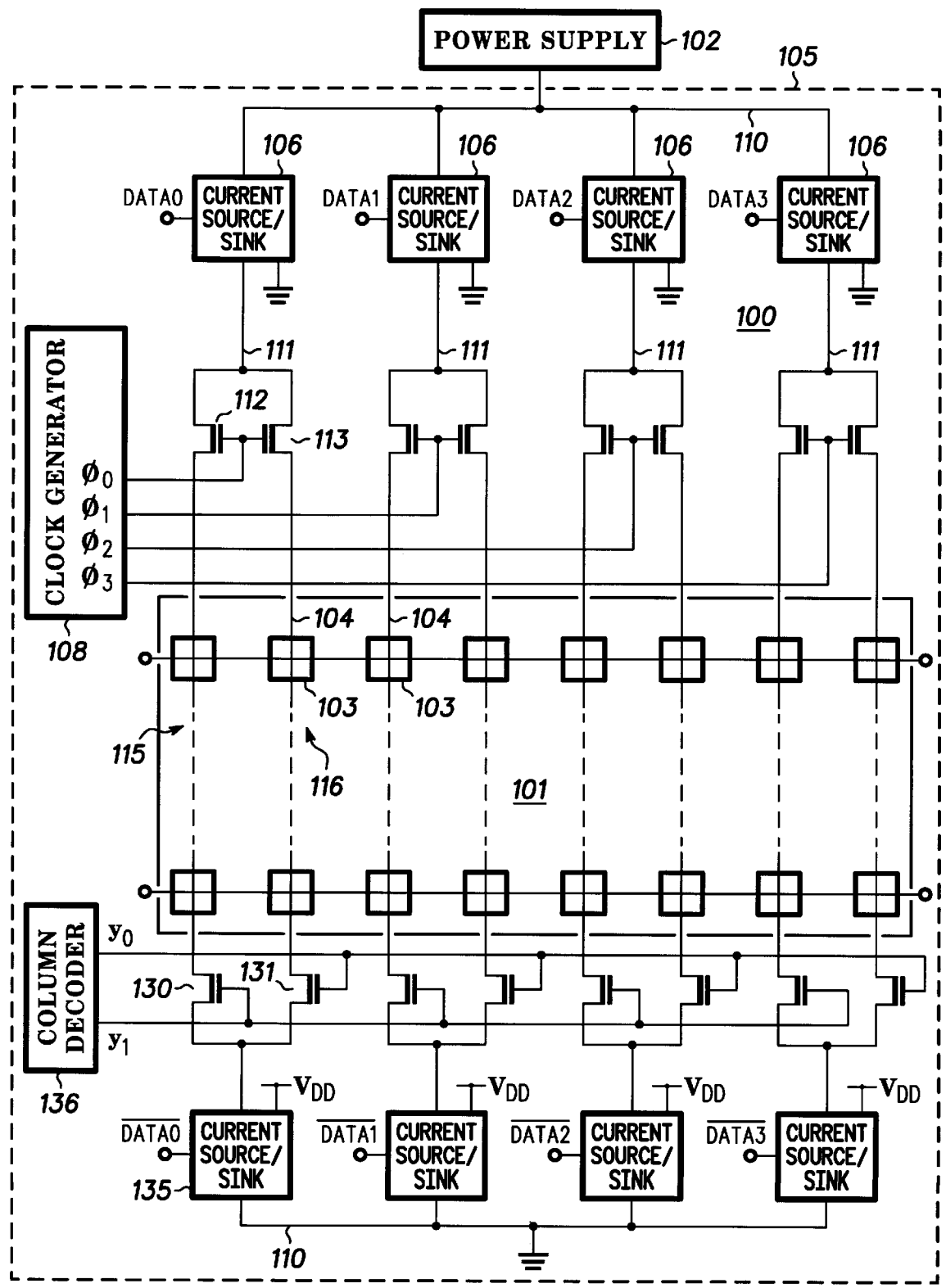
FIG. 4 is a schematic view of a preferred embodiment of apparatus including a memory connected to a power supply in accordance with the present invention.

Turning now to FIG. 4, a schematic view is illustrated of a preferred embodiment of apparatus, designated 100, including a memory 101 connected to a power supply 102 for programming in accordance with the present invention. Memory 101 includes an array of memory cells 103 arranged in rows and columns and having a plurality of current terminals 104. Memory cells 103 are integrated into a semiconductor chip 105, along with current terminals 104, current sources/sinks 106 and a clock generator 108. Generally, programming current is supplied to each current source/sink 106 from power supply 102 by means of connections or current supply lines 110, which are made up of metal and vias connecting the layers of metal together. Current supply lines 110 may also be interpreted to include current return lines, also designated 110 in this embodiment, on the opposite side of memory 101.

Each current source/sink 106 (and each current source/sink 135 to be explained presently) is illustrated with one control input which receives program data bits and inverse program data bits, respectively. The binary logic state of the data bits controls the direction of bitline program current through each column of memory cells 103. As an example, current passes from power supply 102 through each current source/sink 106 to an output lead 111. Each output lead 111 is connected to the common connected drains of a pair of switching transistors 112 and 113. The source of switching transistor 112 is connected through a first column 115 of memory cells 103 and the source of switching transistor 113 is connected through a second column 116 of memory cells 103. The gates or control terminals of both of the pair of switching transistors 112 and 113 are connected together and to one of a plurality of different phased outputs of multi-phase clock generator 108. Second, third, and fourth pairs of switching transistors are similarly connected to second, third, and fourth current sources/sinks 106 and to third and fourth, fifth and sixth, and seventh and eighth columns of memory cells, respectively. Also the gates of the second, third, and fourth pairs of switching transistors are connected to different phased outputs of multi-phase clock generator 108.

Figure 5:
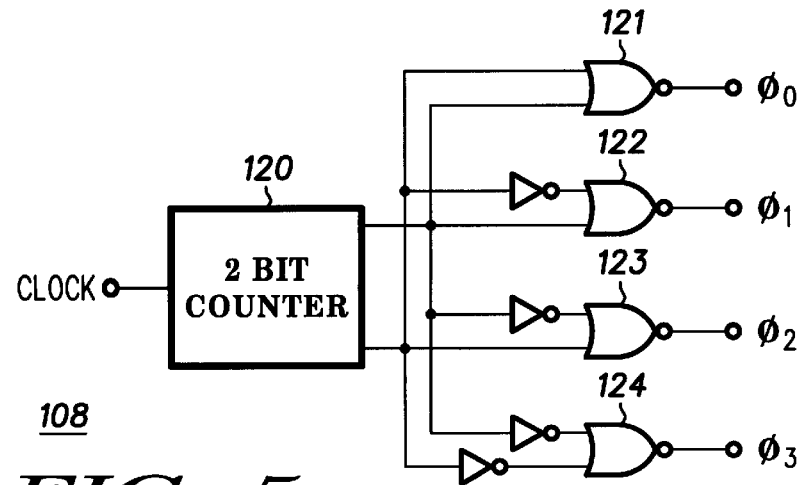
FIG. 5 is a schematic view of a multi-phase clock generator for use in the apparatus of FIG. 4.

A simplified example of a multi-phase clock generator which can be used as clock generator 108 is illustrated in FIG. 5. A clock input is supplied to a two bit counter 120 which supplies output signals to four NOR logic gates 121, 122, 123, and 124. The two output signals from counter 120 are supplied directly to gate 121 to produce a first phase signal at the output of gate 121. The first of the two output signals from counter 120 is supplied directly to one input of gate 122 and the second output signal is inverted to produce a second phase signal at the output of gate 122. The first of the two output signals from counter 120 is inverted and supplied to one input of gate 123 and the second output signal is supplied directly to produce a third phase signal at the output of gate 123. The first and second of the two output signals from counter 120 are both inverted and supplied to the two inputs of gate 124 to produce a fourth phase signal at the output of gate 124. Thus, four non-overlapping phase signals are provided at the four outputs of multi-phase clock generator 108. It will be understood that many different types of clock generators can be devised and the one illustrated in FIG. 5 is simply illustrated as an example.

Thus, the four non-overlapping clock phase signals are applied to the first, second, third, and fourth pairs of switching transistors, respectively, to apply programming current from the associated current source/sink 106 and power supply 102 to the connected pair of columns of memory cells (e.g. 115 and 116, etc.). The drain terminals of a second pair of switching transistors 130 and 131 are connected at the lower ends of the pair of columns 115 and 116, respectively, and a similar pair of switching transistors is connected to the lower ends of each of the other pairs of columns. The source terminals of transistors 130 and 131 are connected together and through a current source/sink 135 to a common, such as ground. The gate of transistor 130 is connected to a first output of a column decoder 136 and the gate of transistor 131 is connected to a second output of decoder 136. Non-overlapping alternating switching signals are available on the two outputs of decoding circuit 136 so that either transistor 130 is conducting or transistor 131 is conducting. Each of the other similar pairs of switching transistors are similarly connected to decoding circuit 136.

Here it should be understood that each current source/sink 106 and current source/sink 135 associated with each pair of columns is switched to control the amount and direction of programming current flowing in the columns. However, since these circuits are not a part of this invention, no further description will be provided.

Figure 6:
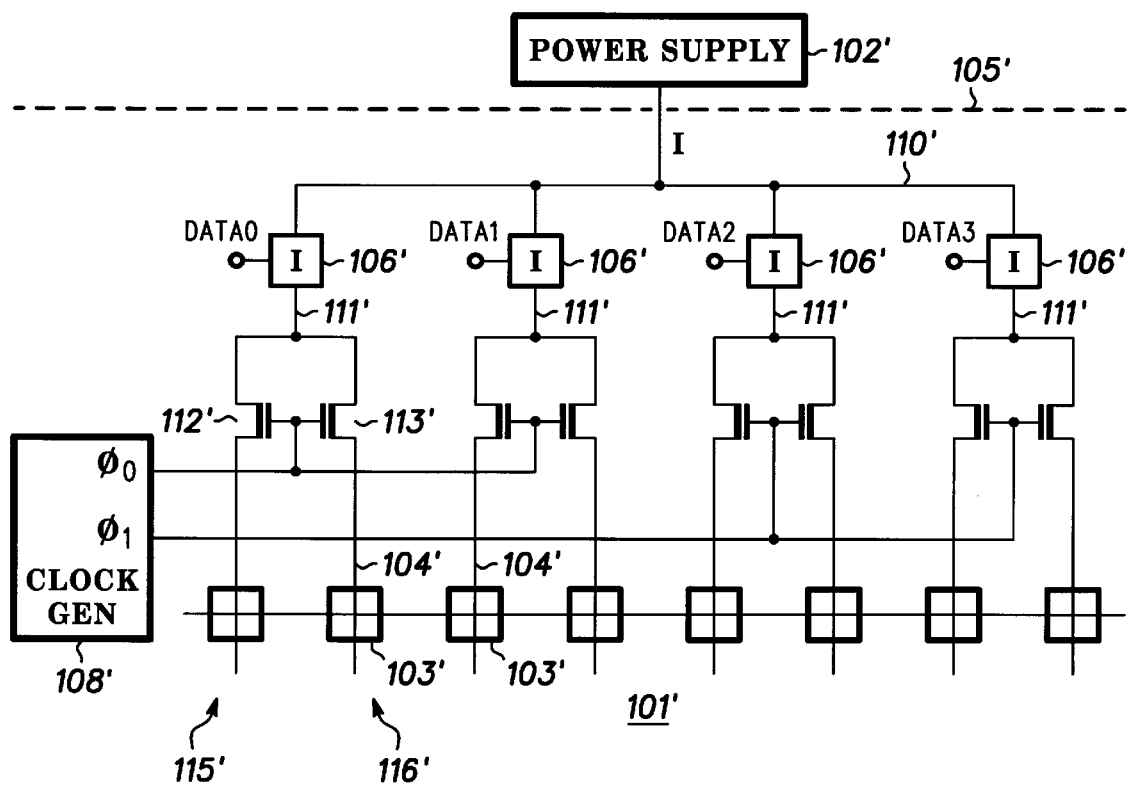
FIG. 6 is a simplified schematic view of another embodiment of apparatus similar to FIG. 4 and connected in accordance with the present invention.

Referring specifically to FIG. 6, a simplified schematic view is illustrated of another embodiment of apparatus, designated 100', similar to FIG. 4 and connected in accordance with the present invention. In this embodiment, components which are similar to the embodiment illustrated in FIG. 4 are designated with similar numbers and a prime is added to the numbers to indicate a different embodiment. Apparatus 100' includes a memory 101' connected to a power supply 102' for programming in accordance with the present invention. Memory 101' includes an array of memory cells 103' arranged in rows and columns and having a plurality of current terminals 104'. Memory cells 103' are integrated into a semiconductor chip 105', along with current terminals 104', current sources/sinks 106' and a clock generator 108'. Generally, programming current is supplied to each current source/sink 106' from power supply 102' by means of connections or current supply lines 110', which are made up of metal and vias connecting the layers of metal together. Current supply lines 110' may also be interpreted to include current return lines (not shown) on the opposite side of memory 101'.

Each current source/sink 106' is illustrated with one control input which receives program data bits and inverse program data bits, respectively. The binary logic state of the data bits controls the direction of bitline program current through each column of memory cells 103'. As an example, current passes from power supply 102' through each current source/sink 106' to an output lead 111'. Each output lead 111' is connected to the common connected drains of a pair of switching transistors 112' and 113'. The source of switching transistor 112' is connected through a first column 115' of memory cells 103' and the source of switching transistor 113' is connected through a second column 116' of memory cells 103'. The gates or control terminals of both of the pair of switching transistors 112' and 113' are connected together and to $\phi_0$ of a plurality (n) of different phased outputs of multi-phase clock generator 108'.

This embodiment differs from the embodiment illustrated in FIG. 4 in that the common connected gates or control terminals of a second pair of switching transistors 112' and 113' are also connected to be activated by the $\phi_0$ output of multi-phase clock generator 108'. Similarly, the common connected gates of the third and fourth pairs of switching transistors are connected to a different phased output (e.g. $\phi_1$) of multi-phase clock generator 108'. As in the previous embodiment, one of the columns 115' or 116' is selected by a column decoder (not shown) and one of the columns of the second pair of columns is selected simultaneously. Thus, in this embodiment, programming current is supplied to two columns of memory cells 103' simultaneously and the current supplied by power supply 102' through current supply lines 110' is 2I. While the programming current is twice as high as in the embodiments described above, it will be understood that it still can be low enough so that little or no electromigration occurs, depending upon the construction of the lines and vias in current supply lines 110'. Further, any number of simultaneous programming current paths or terminals, hereinafter referred to as a "set" of current paths or terminals, may be selected as long as the total current flowing at any time in current supply lines 110' is low enough so that little or no electromigration occurs.

Thus, apparatus for reducing peak program current in memories is disclosed wherein only one set of programming current terminals is conducting current at a time. Therefore, connections or current supply lines made up of metal and vias connecting the layers of metal together only have a current flowing at any time which is less than a current that produces electromigration so that the life and reliability of the apparatus is substantially improved. While the embodiments illustrated and described have only one or two current terminals conducting current at any time with one or two columns of memory cells connected to the current terminal, it will be understood that in some embodiments it may be convenient to connect more columns of memory cells to current terminals, for example, it might be convenient to program two, three, or more memory cells at a time. In such an arrangement, more than one programming current would flow at a time but it could still be limited to a current well below one that produces electromigration.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. Apparatus for reducing peak program current in an array of magnetic tunneling junction magnetic random access memory cells arranged in rows and columns, having n programming paths and a total of I programming current in the n paths, including n switches connected in the n programming paths, one switch for each programming path, the n switches being operable one at a time to reduce instantaneous programming current to 1/n of I.

2. Apparatus for reducing peak program current in a magnetic random access memory incorporated in an integrated circuit including current supply lines made up of layers of metal and vias connecting the layers of metal together and constructed so that nI current produces electromigration in the current supply lines, the memory having n programming paths and a total of I programming current in each of the n paths, the apparatus including n switches connected in the n programming paths, one switch for each programming path, the n switches being connected so that at least one and less than n are simultaneously operable to produce a total programming current less than nI at any instant.

3. Apparatus for reducing peak program current in memories comprising:
a memory including an array of memory cells arranged in rows and columns and having a plurality of current terminals;
a current supply;
an electronic switch coupling the current supply to the plurality of current terminals, the electronic switch including at least one switching input constructed to receive a clock signal for switching the electronic switch to sequentially couple the current supply to each current terminal of the plurality of current terminals; and a clock generator constructed to provide a sequential clock signal to the switching input of the electronic switch so as to sequentially supply current from the current supply to each current terminal of the plurality of current terminals.

4. Apparatus for reducing peak program current in memories as claimed in claim 3 wherein the plurality of current terminals of the memory includes one current terminal for each memory cell in an n-bit word.

5. Apparatus for reducing peak program current in memories as claimed in claim 3 wherein the memory including the array of memory cells is integrated into a semiconductor chip and connections to the current supply within the semiconductor chip are fabricated in a plurality of layers of metal connected by vias in the semiconductor chip.

6. Apparatus for reducing peak program current in memories as claimed in claim 4 wherein the array of memory cells includes magnetic random access memory cells.

7. Apparatus for reducing peak program current in memories as claimed in claim 6 wherein the magnetic random access memory cells include tunnel junction magnetic random access memory cells.

8. Apparatus for reducing peak program current in memories as claimed in claim 6 wherein the electronic switch coupling the current supply to the plurality of current terminals is integrated into the semiconductor chip between the array of memory cells and the connections to the current supply.

9. Apparatus for reducing peak program current in memories comprising:

a memory including an array of memory cells arranged in rows and columns and having a plurality of programming current terminals;

a plurality of current sources/sinks coupled one each to each of the plurality of current terminals so as to provide a plurality of current sources/sinks each with an associated current terminal, each current source/sink including an electronic switch connected to supply current from the current source/sink to the associated current terminal in an ON mode and to not supply current to the associated current terminal in an OFF mode, and each electronic switch including a switching input constructed to receive a clock signal for switching the electronic switch between the OFF mode and the ON mode; and a clock generator having a plurality of outputs one each coupled to the switching input of each electronic switch of the plurality of current sources/sinks, the clock generator being constructed to sequentially provide a clock signal to each of the plurality of switching inputs.

10. Apparatus for reducing peak program current in memories as claimed in claim 9 wherein the plurality of current terminals of the memory includes one current terminal for each memory cell in an n-bit word.

11. Apparatus for reducing peak program current in memories as claimed in claim 9 wherein the memory including the array of memory cells and the plurality of current sources/sinks are integrated into a semiconductor chip and connections within the semiconductor chip between the plurality of current sources/sinks and a current supply are fabricated in a plurality of layers of metal connected by vias in the semiconductor chip.

12. Apparatus for reducing peak program current in memories as claimed in claim 11 wherein the array of memory cells includes magnetic random access memory cells.

13. Apparatus for reducing peak program current in memories as claimed in claim 12 wherein the magnetic random access memory cells include tunnel junction magnetic random access memory cells.

14. A method for reducing peak program current in memories comprising the steps of:

providing a magnetic random access memory incorporated in an integrated circuit including current supply lines made up of layers of metal and vias connecting the layers of metal together and constructed so that nI current produces electromigration in the current supply lines, the magnetic random access memory having n programming paths and a total of I programming current in each of the n paths;

connecting n switches in the n programming paths, one switch for each programming path; and operating the n switches so that at least one and less than n are simultaneously closed to produce a total programming current less than nI at any instant.

15. A method for reducing peak program current in memories comprising the steps of:

providing a memory including an array of magnetic random access memory cells arranged in rows and columns and having a plurality of programming current terminals; and sequentially supplying programming current to each current terminal of the plurality of current terminals.

16. A method for reducing peak program current in memories as claimed in claim 15 wherein the step of providing the memory having the plurality of current terminals includes providing a memory having one current terminal for each magnetic random access memory cell in an n-bit word.

17. A method for reducing peak program current in memories as claimed in claim 15 wherein the step of providing the memory including the array of magnetic random access memory cells includes integrating the memory into a semiconductor chip and fabricating connections to the current supply within the semiconductor chip in a plurality of layers of metal connected by vias in the semiconductor chip.

18. A method for reducing peak program current in memories as claimed in claim 15 wherein the step of providing the magnetic random access memory cells includes providing tunnel junction magnetic random access memory cells.

19. A method for reducing peak program current in memories as claimed in claim 17 wherein the step of sequentially supplying current to each current terminal of the plurality of current terminals includes integrating a plurality of current sources/sinks into the semiconductor chip between the array of memory cells and the connections to the current supply within the semiconductor chip and sequentially operating the current sources/sinks.

* * * * *

UNITED STATES PATENT AND TRADEMARK OFFICE
CERTIFICATE OF CORRECTION

PATENT NO.     : 6,236,611 B1
DATED          : May 22, 2001
INVENTOR(S)    : Naji It is certified that error appears in the above-identified patent and that said Letters Patent is hereby corrected as shown below:

<u>Column 1,</u>
Line 3, after the Title, please add as a new first paragraph the following paragraph:
   -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*